United States Patent [19]

Ota et al.

[11] 4,064,537

[45] Dec. 20, 1977

[54] AMPLITUDE LIMITING CIRCUIT FOR FREQUENCY MODULATED VIDEO SIGNALS

[75] Inventors: Yoshihiko Ota, Yokohama; Akira Hirota, Chigasaki, both of Japan

[73] Assignee: Victor Company of Japan, Ltd., Yokohama, Japan

[21] Appl. No.: 704,848

[22] Filed: July 13, 1976

[30] Foreign Application Priority Data

July 14, 1975 Japan .............................. 50-96679[U]

[51] Int. Cl.² .............................................. H04N 5/76
[52] U.S. Cl. ..................................... 358/127; 360/33; 358/281; 358/296; 307/237
[58] Field of Search ....................... 360/33, 34, 30, 26, 360/67; 358/127, 296, 281; 328/171, 169, 167; 307/237; 325/477, 473, 472

[56] References Cited

U.S. PATENT DOCUMENTS

| 3,532,808 | 10/1970 | Fujisawa | 360/33 |
|---|---|---|---|
| 3,626,087 | 12/1971 | Tomioka | 360/33 |

Primary Examiner—Bernard Konick
Assistant Examiner—Alan Faber

[57] ABSTRACT

An amplitude limiting circuit comprises a high-pass filter for passing the high frequency components of a frequency modulated video signal. The centerline of a signal portion has an amplitude width which is non-linear. A first amplitude limiter both limits and amplifies the output signal from the high-pass filter. A low-pass filter passes the low frequency component of the frequency modulated video signal. An adder adds the resulting output signals of the first amplitude limiter and the low-pass filter. A second amplitude limiter limits the resulting output of the adder.

5 Claims, 8 Drawing Figures

AMPLITUDE LIMITING CIRCUIT FOR FREQUENCY MODULATED VIDEO SIGNALS

BACKGROUND OF THE INVENTION

The present invention relates generally to amplitude limiting circuits for frequency-modulated video signals, and more particularly to a circuit for amplitude limiting a frequency-modulated video signal reproduced from a magnetic tape. The invention prevents an inversion phenomenon, in which "black" and "white" subjects are inverted in a picture reproduced by a television receiver.

In a magnetic tape, frequency modulated, video signal, recording system, the high frequency video signal components are increased by a pre-emphasis circuit, before frequency modulation, in order to decrease relatively the noise components. In general, video signal frequency modulators use a positive modulation in which a white peak of the video signal corresponds to the upper limit of a deviation of a carrier frequency modulated by the video signal. A tip of a synchronizing signal in the video signal corresponds to the lower limit of the deviation. Accordingly, if pre-emphasis is large, when the content of the video signal changes abruptly from black to white, for example, overshoots are apt to be generated in the video signal at a portion wherein a picture changes from black to white.

When the overshoots are generated, a portion of the frequency-modulated carrier corresponding to the overshoots protrude beyond the upper limit of the predetermined deviation. High frequency signal components protruding beyond the upper limit of the deviation are not readily recorded and reproduced. Thus, the level of the reproduced signal becomes small. Accordingly, information signal components are lost when the reproduced signal passes through an amplitude limiter. The signal frequency corresponding to the overshoots is lowered to an extreme degree. At that time, a portion of the signal representing "white" (normally a high frequency) becomes a low frequency which represents "black". As a result, the so-called inversion phenomenon is produced in the reproduced picture wherein an originally white portion of the picture is inverted into "black".

In order to prevent such an inversion phenomenon, a white clipping circuit for removing the overshoots has been used heretofore in the recording system. However, if there is a large white clipping quantity, a portion of the information signal is removed, whereby a good reproducing picture characteristic cannot be obtained.

It is conceivable to increase the level of the reproduced signal with respect to the high frequency band which is higher than the upper limit of the deviation in order to prevent inversion phenomenon. However, this approach is accompanied by an increasing of the noise component level and accordingly a lowering of the signal to noise ratio. Therefore, this conceivable approach is undesirable in actual practice.

SUMMARY OF THE INVENTION

A general object of the invention is to provide a novel and useful amplitude limiting circuit for frequency-modulated video signals wherein the above described problems are solved.

Another object of the invention is to provide an amplitude limiting circuit for a frequency-modulated video signal to remove undesired components which produce the inversion phenomenon.

A further object of the present invention is to provide an amplitude limiting circuit for a frequency-modulated video signal reproduced from a recording medium.

According to the present invention, the amplitude limiting circuit limits the amplitude of specific signal portions so as not to produce the inversion phenomenon of black and white. The specific signal portions are those which are conducive to the inversion phenomenon, when the specific signal portion is amplitude limited by a conventional amplitude limiting circuit.

Further objects and features of the present invention will be apparent from the following detailed description when read in conjunction with the accompanying drawings.

DETAILED DESCRIPTION

Figure 1:
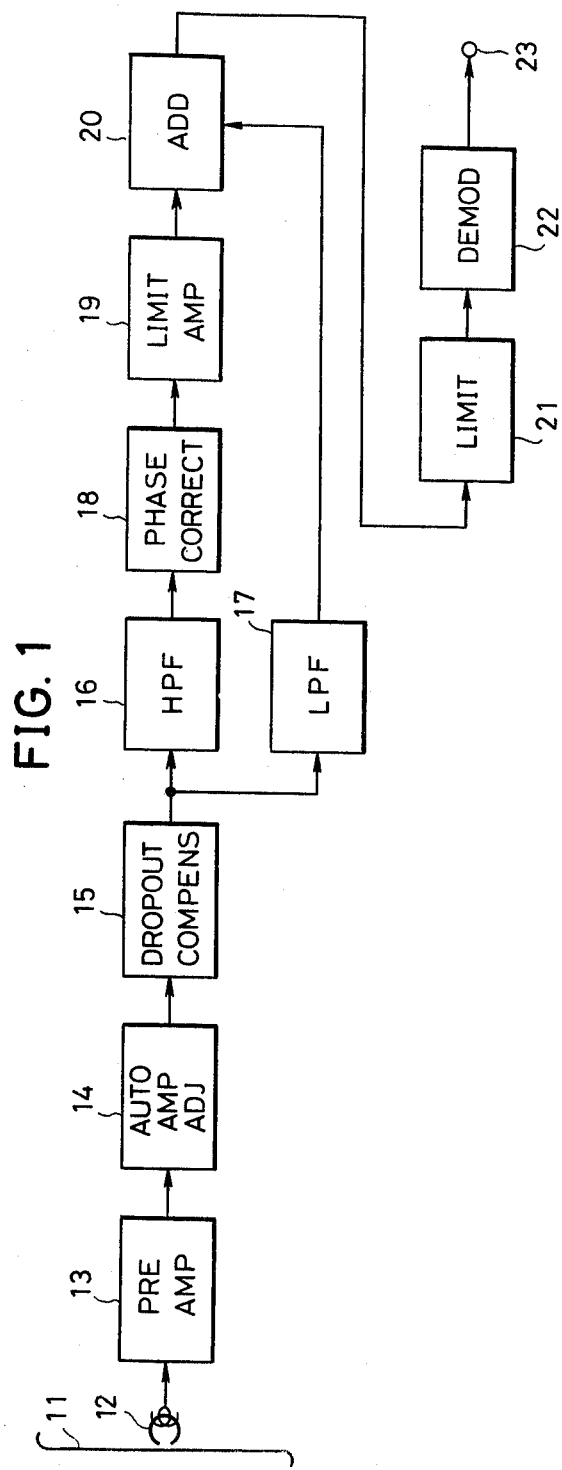
FIG. 1 is a block diagram of a video signal reproducing system using one embodiment of an amplitude limiting circuit, according to the present invention.

In the system illustrated in FIG. 1, a frequency modulated video signal recorded on a magnetic tape 11 is reproduced by a reproducing magnetic head 12. The reproduced signal is amplified in a pre-amplifier 13. Thereafter an automatic amplitude adjuster 14 suppresses the gentle fluctuation of the signal amplitude due to differences of sensitivity of the magnetic tape and magnetic head, tracking error, and the like. A dropout compensator 15 compensates for any dropout in the output of adjuster 14. Thereafter, the compensated signal is supplied to a high-pass filter 16 and a low-pass filter 17. The dropout compensator 15 is a well-known circuit which detects an absence of signal or a dropout in the reproduced signal and replaces the lost signal by a signal which is obtained by delaying the signal immediately preceding one horizontal scanning period for a period equal to.

Figure 2:
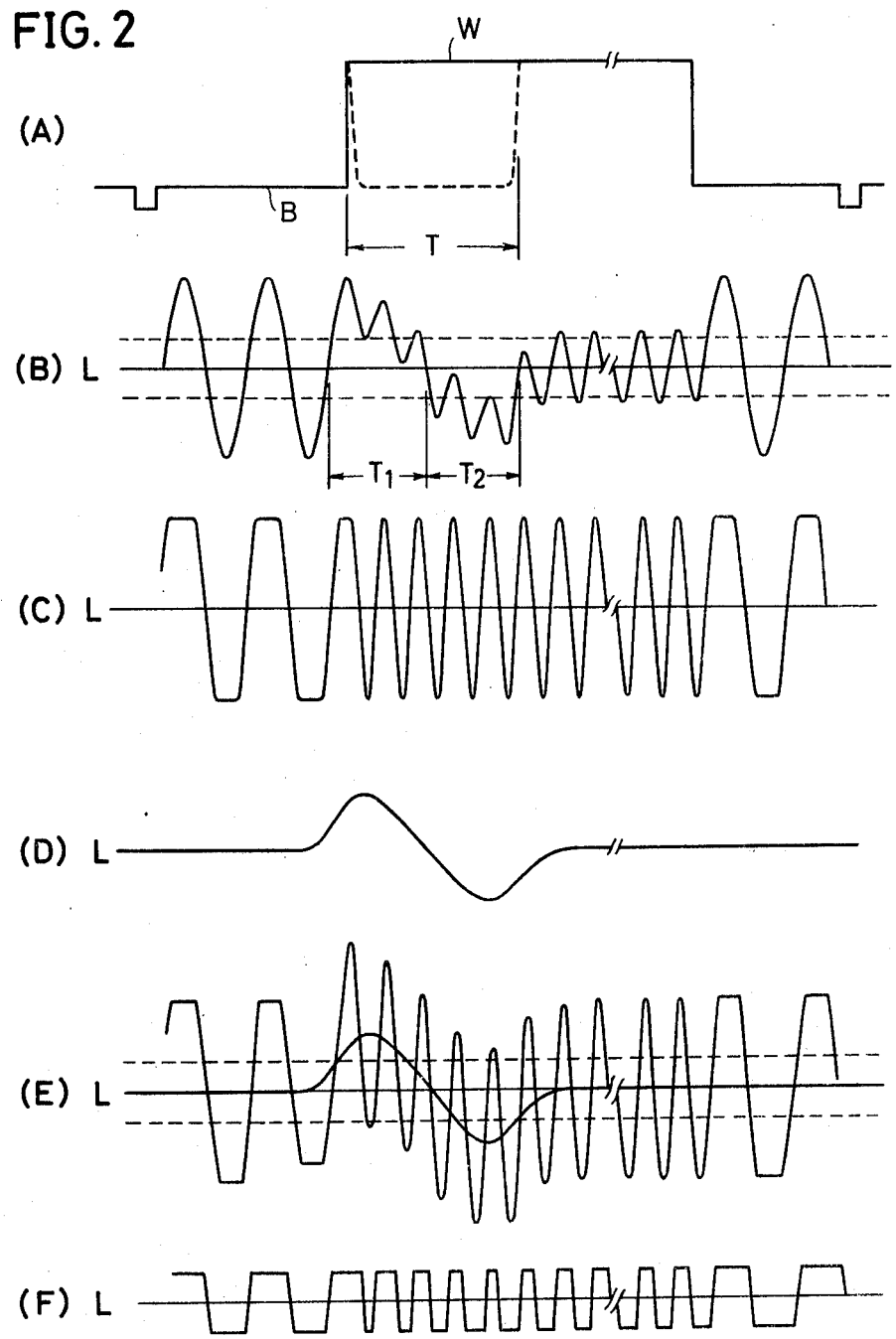
FIG. 2(A) through FIG. 2(F) are waveform, time charts respectively showing signals at different points in the block diagram illustrated in FIG. 1.

It will be assumed that a modulating video signal in a recording system instantaneously changes its level from a "black" level B to a "white" level W, as shown in FIG. 2(A). The frequency modulated video signal which has been recorded and reproduced has a waveform as shown in FIG. 2(B). In the recording systems, the carrier wave is frequency modulated responsive to a video signal. At this time, there is a positive frequency modulation wherein the white peak of the video signal corresponds to the upper limit of the deviation and the tip of the synchronizing signal corresponds to the lower limit of the deviation. Accordingly, when the video signal changes instantaneously, its level from black to white, the frequency modulated signal changes abruptly from low to high frequency.

The high frequency component is not readily recorded and reproduced. It exceeds the capability of the magnetic recording and reproducing apparatus. This capability is determined by the characteristics of the magnetic tape and magnetic head, the speed of the magnetic tape relative to the magnetic head, and other factors. Upon an abrupt change to a high frequency, the level of the reproduced signal is abruptly lowered. As a result, the waveform of the reproduced frequency modulated signal becomes abnormal, as shown in FIG. 2(B), during a brief time interval T. The interval T starts with the instant when the modulating video signal changes from black to white.

If the signal shown in FIG. 2(B) is amplitude limited at levels shown by dotted lines, the frequency of the amplitude limited signal becomes very low during a time interval ($T1 + T2 \div T$), because the waveform does not cross over a straight centerline L within respective intervals $T1$ and $T2$. As a result of the generally lowering frequency of the frequency modulated video signal, a level which should be inherently white drops to a black level, in a demodulated video signal, as shown by dotted line in FIG. 2(A). In a picture reproduced on a television receiver, a portion which should inherently be "white" will appear "black", whereby the inversion phenomenon will occur.

The present invention removes the above described disadvantages, as described hereinbelow.

The high-pass filter 16 (FIG. 1) removes the low frequency component (FIG. 2(B)) of the frequency modulated video signal. Only the frequency modulated carrier component passes through the high-pass filter 16. The passed carrier component is corrected in phase in a phase corrector 18 and thereafter supplied to a limiting amplifier 19. The phase corrector 18 causes the phase of the signal passed through the high-pass filter 16 to coincide with the phase of the signal passed through the low-pass filter 17. The phase corrector may be provided at an input of the high-pass filter 16 or at an output stage of the limiting amplifier 19.

The amplitude of the modulated carrier component is limited and amplifed in the limiting amplifier 19, to become as shown in FIG. 2(C). This signal component has been passed through the high-pass filter 16, and therefore its low frequency fluctuation component has been removed during the interval T. Accordingly, the signal waveform FIG. 2(C), crosses the centerline L even during the interval T, and it has sufficiently large amplitude. The output of the limiting amplifier 19 is supplied to an adder 20.

On the other hand, the signal shown in FIG. 2(B), has its frequency modulated carrier component removed in the low-pass filter 17. The low frequency component, including the lower side bands of the frequency modulated video signal passes through the low-pass filter 17, as shown in FIG. 2(D). Side bands are actually generated as a result of the variations between balck and white levels of the video signal. However, to simplify the description, FIG. 2(D) exemplifies a waveform accompanyed by no sideband, where the video signal maintains its white level after it is instantaneously changed from black to white.

A non-linear or curved line FIG. 2(D), indicates a fluctuation of the low frequency within the signal waveform of FIG. 2(B), during the time interval T. Stated otherwise, FIG. 2(B) shows a fluctuation of a centerline connecting the intermediate points of the amplitude width at the crests of respective waves. The output signal of the low-pass filter 17 is supplied to the adder 20.

The adder 20 adds or mixes the signal from the limiting amplifier 19 having the waveform shown in FIG. 2(C) from the low-pass filter 17 and the signal having the waveform shown in FIG. 2(D). A signal having a waveform as shown in FIG. 2(E) is thereby derived from the adder 20. The output of the adder 20 is a signal wherein the side band component is added to the modulated carrier component. Therefore, the output signal does not lack or lose the quantity of the signal to be transmitted. As clearly shown in FIG. 2(E), the waveform of this output signal crosses over the straight centerline L even during the time interval T.

This output signal (FIG. 2(E)) from the adder 20 is supplied to a limiter 21 and is amplitude limited at levels shown by dotted lines. As a result, an output signal having a waveform as shown in FIG. 2(F) is derived from the limiter 21. This signal does not have any signal waveform portion which fails to cross the centerline L, as indicated in FIG. 2(B).

The frequency modulated video signal which has been amplitude limited in the limiter 21 is demodulated in a demodulator 22. The demodulated video signal is derived out from an output terminal 23 and is supplied to a television receiver (not shown). Since the undesired low frequency fluctuation component has already been removed from the output signal of the limiter 21, the picutre portion which should be "white" is reproduced as "white" in the reproduced picture of the television receiver. Accordingly, the inversion phenomenon does not occur.

In the above described embodiment of the invention, the high-pass filter 16 and the low-pass filter 17 have relatively gentle decreasing or attenuating characterisitics, respectively, such as those of a general differential circuit or integration circuit. The cross-over frequency of the decreasing characteristics of both filters 16 and 17 is a frequency corresponding to the lower deviation limit of the frequency modulated carrier, for example.

One embodiment of an acutal circuit of the block diagram illustrated in FIG. 1 is described below, with reference to FIG. 3.

Figure 3:
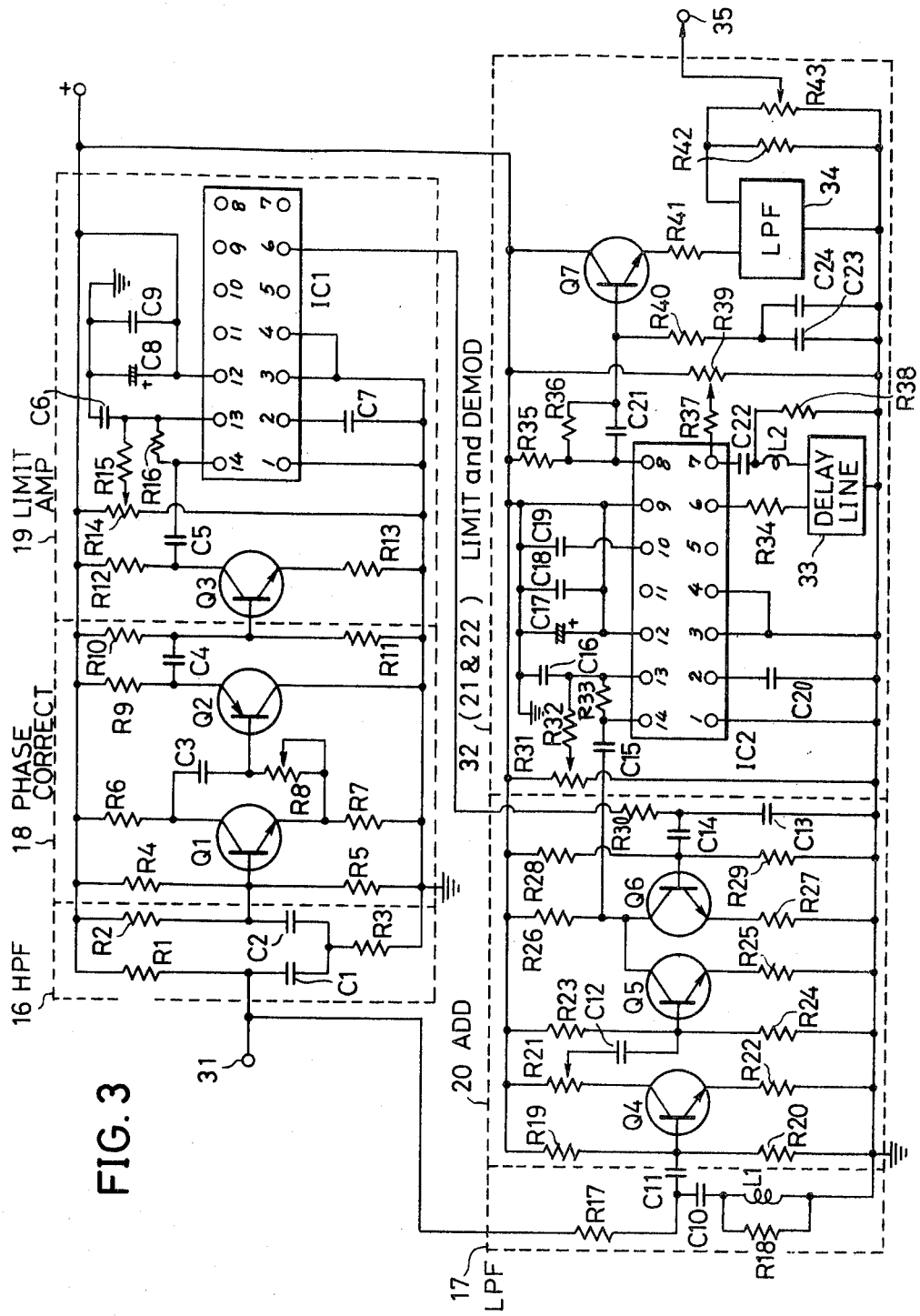
FIG. 3 is a schematic circuit diagram of an essential part of the block diagram illustrated in FIG. 1.

The reproduced frequency modulated video signal is supplied from the dropout compensator 15 (FIG. 1) to an input terminal 31 (FIG. 3). This input signal is supplied to the high-pass filter 16, which comprises resistors R1 through R3 and capacitors C1 and C2, and to the low-pass filter 17, which comprises resistors R17 and R18, capacitors C10 and C11, and a coil L1. The frequency modulated carrier component, which has been passed through the high-pass filter 16, is corrected in phase at the phase corrector 18 which comprises resistors R4 through R11, capacitors C3 and C4, and transistors Q1 and Q2. Thereafter, it is supplied to the limiting amplifier 19 which comprises resistors R12 through R16, capacitors C5 through C9, a transistor Q3, and an integrated circuit IC1. The modulated carrier component is amplitude limited and amplified in the limiting amplifier 19. The output signal derived from sixth pin of the integrated circuit IC1 is applied through a resistor R30 and a capacitor C14 to the base of a transistor Q6 of the adder 20. The adder 20 comprises resistors R19 through R30, capacitors C12 through C14, and transistors Q4 through Q6.

The signal component (including the lower side bands) which has passed through the low-pass filter 17 is applied through the transistor Q4 of the adder 20 to the base of the transistors Q5. Both signals thus supplied to the adder 20 are added at a point connecting the collectors of the transistors Q5 and Q6. The added output signal is supplied to an integration circuit IC2 of a circuit 32.

The circuit 32 (FIG. 3) operates both as the limiter 21 and as the demodulator 22 (FIG. 1). The circuit 32 comprises resistors R31 through R43, capacitors C15 through C24, a coil L2, the integrated circuit IC2, a transistor Q7, a delay line 33, and a low-pass filter 34. The signal supplied to the integrated circuit IC2 is amplitude limited and thereafter demodulated. The demodulated output signal is derived from the eighth pin of the integrated circuit IC2 and supplied to a de-emphasis circuit which comprises resistors R36, R40, and R41, capacitors C21, C23, and C24, and the transistor Q7. The output signal from the de-emphasis circuit has no unnecessary component in the low-pass filter 34, having the upper limit frequency of 3 MHz, and is derived from an output terminal 35 as a demodulated reproduced signal.

If the modulating video signal is a color video signal, the luminance signal component of the color video signal is passed through the amplitude limiting circuit.

Further, this invention is not limited to these embodiments thereof, but variations and modifications may be made therein without departing from the scope and spirit of the invention.

What is claimed is:

1. An amplitude limiting circuit comprising:
    a source of frequency modulated video signals including a signal portion having a nonlinear centerline between the amplitude crests of the waveforms;
    high-pass filtering means for passing the high frequency component of the frequency modulated video signal;
    first amplitude limiting means for limiting the amplitude of the resulting output of the high-pass filtering means;
    low-pass filtering means for passing the low frequency component of the frequency modulated video signal;
    means for adding the output signal of the first amplitude limiting means and the output of the low-pass filtering means; and
    second amplitude limiting means for limiting the amplitude of the resulting output of the adding means.

2. An amplitude limiting circuit as claimed in claim 1 wherein said source of video signals comprises means for reproducing frequency modulated video signal recorded on a recordng medium, and said video signal includes a signal waveform portion which does not cross over a straight centerline between the amplitude crests.

3. An amplitude limiting circuit as claimed in claim 1 wherein said high-pass filtering means has a filtering characteristic for passing substantially a carrier component of the frequency modulated video signal, and said low-pass filtering means has a filtering characteristic for passing a substantially lower side band of the frequency modulated video signal.

4. An amplitude limiting circuit as claimed in claim 1 wherein said high-pass filtering means and said low-pass filtering means have, respectively, decreasing characteristics with relatively gentle slopes which cross over each other, the crossing over frequency of both decreasing characteristics being selected at a frequency which is equal to a lower deviation frequency limit of the frequency modulated video signal.

5. An amplitude limiting circuit as claimed in claim 1 which further comprises means for correcting a phase of a signal passing through the high-pass filtering means thereby causing the phase of the signal passing through the high-pass filtering means to coincide with the phase of the signal passing through the low-pass filtering means.

* * * * *